(12) United States Patent
Wang

(10) Patent No.: US 6,841,317 B2
(45) Date of Patent: Jan. 11, 2005

(54) VENT FOR AN OPTICAL PELLICLE SYSTEM

(75) Inventor: Chung-Bore Wang, Fremont, CA (US)

(73) Assignee: Micro Lithography, Inc., Sunnyvale, CA (US)

( * ) Notice: Subject to any disclaimer, the term of this patent is extended or adjusted under 35 U.S.C. 154(b) by 0 days.

(21) Appl. No.: 10/229,437

(22) Filed: Aug. 27, 2002

(65) Prior Publication Data

US 2004/0043302 A1 Mar. 4, 2004

(51) Int. Cl.⁷ .............................................. G03F 9/00
(52) U.S. Cl. ...................................................... 430/5
(58) Field of Search ............................... 430/5; 428/14; 355/76

(56) References Cited

U.S. PATENT DOCUMENTS

| | | | |
|---|---|---|---|
| 3,927,943 A | 12/1975 | Pohl et al. | 355/132 |
| 4,032,233 A | 6/1977 | Oscarsson et al. | 355/91 |
| 4,159,176 A | 6/1979 | de Masi | 355/79 |
| 4,255,216 A | 3/1981 | Conant et al. | 156/80 |
| 4,470,508 A | 9/1984 | Yen | 206/334 |
| 4,833,051 A | 5/1989 | Imamura | 430/5 |
| 5,168,993 A | 12/1992 | Yen | 206/316.1 |
| 5,254,375 A | 10/1993 | Yen | 428/14 |
| 5,305,878 A | 4/1994 | Yen | 206/316.1 |
| 5,529,819 A | 6/1996 | Campi, Jr. | 428/14 |
| 6,103,427 A | 8/2000 | Storm | 430/5 |
| 6,190,743 B1 | 2/2001 | Wang | 428/14 |
| 6,436,586 B1 * | 8/2002 | Matsuoka et al. | 430/5 |
| 6,524,754 B2 * | 2/2003 | Eynon | 430/5 |

FOREIGN PATENT DOCUMENTS

| | | |
|---|---|---|
| JP | 56-70553 | 6/1981 |
| JP | 58-100852 | 6/1983 |
| JP | 59-125270 | 7/1984 |
| JP | 60-85383 | 5/1985 |

OTHER PUBLICATIONS

SPI vol. 233 Photomask Technology and Management, Robert W. Murphy and Rick Boyd, "The Effect of Pressure Differentials on Pelliclized Photomasks," pp. 187–201 (1994).

* cited by examiner

Primary Examiner—S. Rosasco
(74) Attorney, Agent, or Firm—Kolisch Hartwell, P.C.

(57) ABSTRACT

The present invention provides an optical pellicle system which includes a frame having a top side and bottom side, a pellicle membrane configured to cover the top side of the frame, a photomask to which the bottom side of the frame is mounted, and at least one venting slot defined in the photomask, extending under the frame from an area defined within the frame to an area outside of the frame.

16 Claims, 2 Drawing Sheets

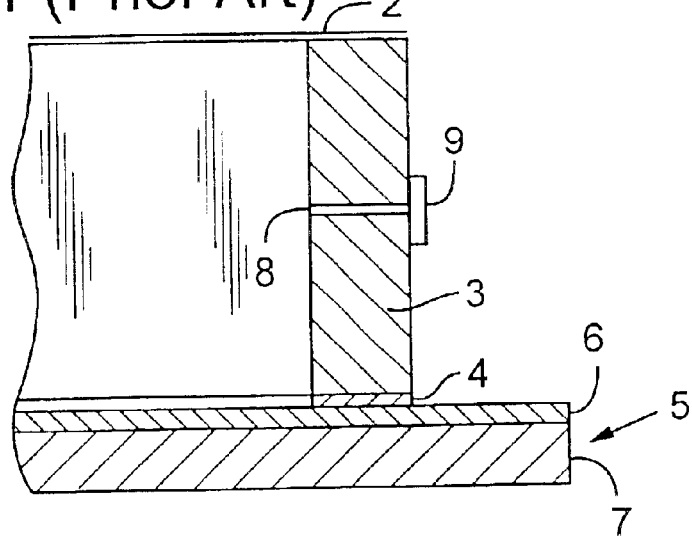
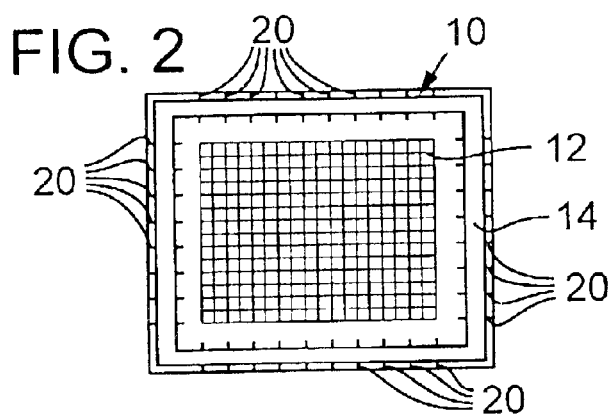
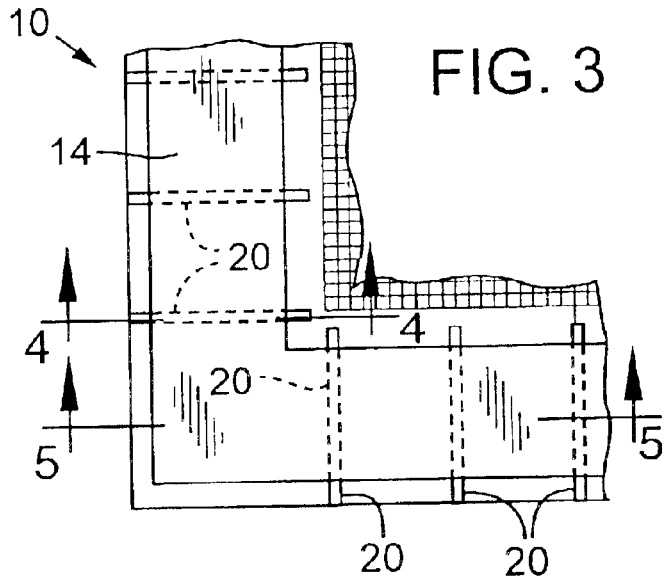

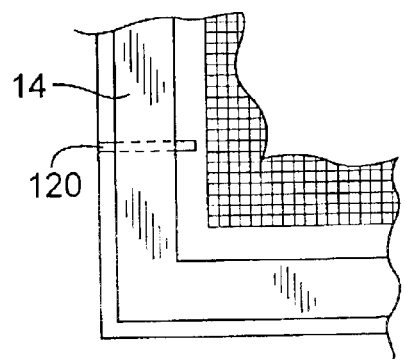
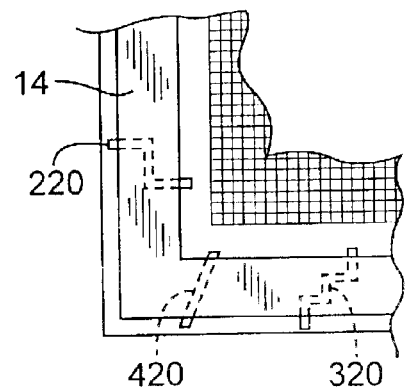
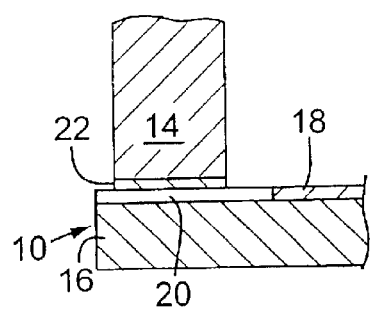
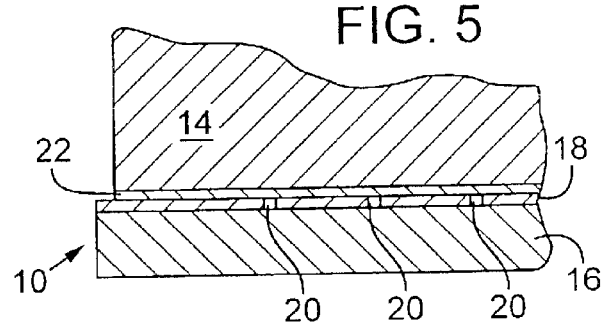
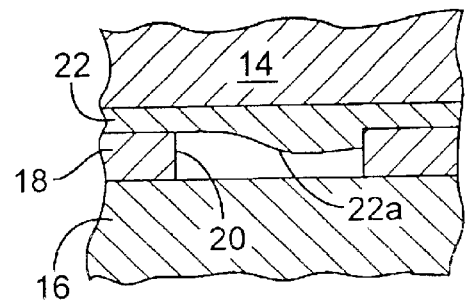

VENT FOR AN OPTICAL PELLICLE SYSTEM

FIELD OF THE INVENTION

The invention relates to optical pellicles that have pressure-equalization slots formed with the photomask.

BACKGROUND OF THE INVENTION

The manufacture of semiconductor devices typically involves applying a layer of a photosensitive substance (a photoresist) to the surface of a target wafer. The photoresist is exposed to light in a selected pattern using a photomask, and the photoresist is then developed to leave exposed regions of the wafer. Typically, the exposed regions are subsequently etched away or otherwise modified, and the residual photoresist is removed. The pattern of the photomask typically possesses extremely fine details, and the presence of even tiny particles on the surface of the photomask can interfere with the accurate reproduction of the pattern on the target wafer.

To minimize particulate contamination at the mask surface, optical pellicles have been developed that protect the photomask. An optical pellicle is a frame-mounted transparent membrane that is attached to the photomask surface, so that contaminating particles fall onto the pellicle membrane and not the surface of the photomask. The pellicle frame holds the pellicle membrane at a sufficient distance above the mask surface so that any particles that may fall upon the membrane lie outside the focal plane of the illuminating light, and so fail to interfere with the projected mask pattern. The use of optical pellicles in semiconductor manufacture has helped mitigate the effects of contamination by dust and other particulates, and has become widespread in the industry.

Pellicles may be packaged such that a protective cover is applied to the pellicle frame, opposite the side of the pellicle. This may create an airtight package with the pellicle, frame, and protective cover. Alternatively, a pellicle may be shipped already adjacent to the photomask, also forming an airtight package.

Pellicle packages are typically airtight to reduce contamination from dust and other contaminate particles. A problem occurs when temperature and pressure change during shipping. This may cause the packaging and/or pellicle to expand and/or contract and pellicles may be damaged as a result. Therefore, pressure equalization orifices have been designed in the frame and in the adhesive layer of a pellicle configuration, some with filters, to allow for pressure equalization without damaging the pellicle and without allowing significant amounts of contaminate particles to enter the area between the pellicle and photomask. However, constructing these orifices is costly and time consuming, and filters are sometimes not effective in filtering out smaller dust and other small particulate.

A related problem has arisen when pellicles are shipped after they have been mounted to a photomask. In this instance, a filtered orifice may not be usable because minute particles enter the orifice and pass through the filter into the space between the pellicle and the photomask. These particles tend to become deposited directly on the photomask, this defeating the purpose of the pellicle.

It is an object of the present invention to overcome the drawbacks of the prior art proposals. Specifically, it is an object of the present invention to develop a system for equalizing the pressure when a pellicle-protected photomask is shipped by air or is otherwise exposed to conditions that cause ambient pressure to increase or decrease.

SUMMARY OF THE INVENTION

The present invention provides an optical pellicle system which includes a frame having a top side and bottom side, a pellicle membrane configured to cover the top side of the frame, a photomask to which the bottom side of the frame is mounted, and at least one venting slot defined in the photomask, extending under the frame from an area defined within the frame to an area outside of the frame.

Another aspect of the invention is a process performing a vented pellicle-protected photomask, comprising the steps of: (1) fabricating a photomask having at least one outwardly-extending venting slot therein; (2) positioning a framed optical pellicle over the photomask; (3) placing the pellicle frame over the venting slot such that the slot extends from beyond one edge of the frame to beyond the other edge; and (4) placing the frame onto the photomask.

Another aspect of the invention provides a photomask including a pattern defined herein. The photomask includes a substrate portion including a pattern formed in at least one side of the substrate, the pattern corresponding to a circuit to be etched during photolithography, the photomask further including a plurality of slots extending outwardly from adjacent the patterned portion.

Yet another aspect of the invention provides a process for venting a pelliclized photomask. This process includes the following steps: (1) fabricating a photomask including a substrate with a pattern formed on at least one surface thereof, the pattern corresponding to a circuit to be etched during photolithography, the photomask further including a plurality of generally outwardly extending venting slots formed on the substrate; (2) mounting a framed pellicle to the photomask, the pellicle including a pellicle frame having a pellicle membrane mounted to an upper surface thereof, the pellicle frame having a lower surface mounted to the photomask such that at least some of the slots extend from a point inward of the pellicle frame to a point outward of the pellicle frame; and (3) venting across the pellicle frame by permitting air to pass through the venting slots.

BRIEF DESCRIPTION OF THE DRAWINGS

FIG. 1 is a side elevation sectional view of a prior art optical pellicle mounted to a chrome-coated photomask wherein the frame of the pellicle has a vent orifice formed therein, with a filter positioned over the exterior side of the orifice;

FIG. 2 is a top plan view of a first embodiment of the present invention, showing a framed pellicle mounted to a photomask;

FIG. 3 is a fragmentary, enlarged top plan view of one corner of the embodiment of FIG. 1;

FIG. 3A is a view corresponding to FIG. 3, depicting a second embodiment of the present invention;

FIG. 3B is a view corresponding to FIG. 3, depicting an additional embodiment showing three possible slot configurations;

FIG. 4 is a fragmentary, side elevation sectional view taken along line 4—4 of FIG. 3;

FIG. 5 is a fragmentary, end elevation sectional view taken along line 5—5 of FIG. 3; and FIG. 6 is a greatly enlarged, fragmentary view corresponding to FIG. 5.

PRIOR ART ATTEMPTS TO SOLVE THE PROBLEM

Before turning to the preferred embodiments, reference should first be made to FIG. 1, which depicts a prior art attempt to solve the problem of increased and decreased ambient pressure occurring during shipping of a pellicle-protected photomask. A pellicle membrane 2 is mounted to a pellicle frame 3 which in turn is mounted by an adhesive layer 4 to a photomask 5 comprised of a chrome coating 6 and a glass substrate 7. Frame 3 includes a substantially horizontally extending orifice channel 8. A filter 9 is mounted to the exterior side of frame 3 adjacent orifice channel 8.

When optical pellicles are shipped to a customer, they typically are in the form of a pellicle membrane such as 2 mounted to a frame such as 3. Because they typically are not as yet mounted to a photomask, a protective plastic cover (not shown in FIG. 1), such as that depicted in my U.S. Pat. No. 5,820,950, is normally utilized. This protective cover is removable, and is generally in the position of photomask 5 in FIG. 1 herein. The protective cover serves to prevent dust and other minute particulate from being deposited on the underside of pellicle membrane 2. This is important because any dust that adheres to the underside of the pellicle membrane would very possibly fall directly onto the photomask once the framed pellicle is mounted in place on the photomask. This dust might be reproduced in the surface of the silicon wafer during photolithography, thereby causing the wafer to be defective.

While the protective cover provides an effective seal to prevent particulate from depositing on the underside of the pellicle membrane, the airtight seal presents a problem when the cover-protected pellicle is transported by air to the customer's facility. Reduced ambient pressure will cause the pellicle membrane to bow outwardly as the atmospheric pressure captured in the space defined by the pellicle membrane, frame and protective cover presses against the thin pellicle membrane. This may stretch or otherwise damage the pellicle membrane or adversely affect the bond between the membrane and the frame. Any such stretching or damage to the pellicle can be critical because it is important that a very high percentage of light pass directly through the pellicle membrane during photolithography, with very minimal reflection or refraction. Any distortion of the light could prevent accurate replication of the photomask pattern in the silicon wafer positioned therebelow during photolithography.

To prevent such damage to the pellicle membrane during shipping, a venting orifice channel such as that shown in FIG. 1 at 8 is sometimes provided in the pellicle frame 3. A filter 9 is typically provided to prevent dust and other particulate from entering the space under the pellicle membrane. Such a filter typically filters out dust and other particulate that is greater than 3 microns in size. Other prior art attempts to solve this problem involve long channels (not shown in FIG. 1 being provided through the frame which might extend into the frame, along the center wall of the frame, and then into the interior space defined below the pellicle membrane. One such attempt is depicted in U.S. Pat. No. 6,103,427 to Storm. Another, somewhat similar attempt is shown in U.S. Pat. No. 5,529,819 to Campi, Jr. Alternatively, a channel (again, not shown in FIG. 1) might be formed through the adhesive layer 4. It has been thought that a longer channel might serve the purpose of equalizing the pressure differential while reducing the likelihood of particulate making it all the way through such a long channel. This was thought to be particularly true when a long channel passes directly through the adhesive layer, because dust and other debris would be likely to adhere to the adhesive rather than being able to pass all the way through the long channel. Many of these prior art techniques have been described in a paper by Robert W. Murphy and Rick Boyd entitled "The Effect of Pressure Differentials on Pelliclized Photomasks."

Despite these prior attempts, it is still possible for dust or very fine particulate to make it all of the way through a long channel whether or not the orifice channel extends through the frame or the adhesive layer, and whether or not a filter is positioned where the orifice channel exits the pellicle frame. Particulate that is smaller than 3 microns can pass through a filter. Where a filter is not used, such as when a channel is directed through the adhesive layer, particulate even larger than 3 microns may enter the area under the pellicle. Moreover, give the fluid nature of some such adhesive, the channel may well collapse, preventing any pressure equalization. More than one such channel may be formed in the adhesive layer, but at some point expense becomes a factor.

These problems may continue to exist as the pellicle is mounted onto the photomask. That is, automated mounting of the pellicle to the photomask may cause an increase in pressure between the photomask and the pellicle membrane as the pellicle is dropped onto the photomask. The pressure differential may also develop after the pellicle is in its final position on the photomask. For example, in some instances a pellicle-protected photomask needs to be shipped, such as if the business that mounts the pellicle to the photomask is someone other than the final photolithography shop. Also, it is possible that there are pressure variations at the photo lithography shop, caused by temperature or other changes in ambient conditions. Therefore, the orifice channel(s) need to be open and operational even after the pellicle is mounted in place on the photomask. Thus, the problem of introduction of particulate remains a continuing problem during the life of the pellicle.

DETAILED DESCRIPTION OF THE PREFERRED EMBODIMENTS

The objects of the present invention are best achieved when the invention takes the form of the photomask 10 depicted in FIGS. 3, 4, 5 and 6. It is known that photomasks are used in photolithography to permit replication of a pattern presented in the photomask into a silicon wafer. FIG. 3 provides a plan view of a schematic depiction of a photomask pattern at 12. The pattern 12 is shown to extend outwardly beyond pellicle frame 14, although it will be understood that the operable portion of the mask pattern typically is positioned inwardly of the pellicle frame.

A photomask typically is formed of a glass substrate 16 (see FIGS. 4, 5 and 6) which includes one or more chrome layers (FIGS. 4, 5 and 6). Chrome layers form a pattern of the circuit desired to be replicated in the silicon wafer. The pattern is schematically depicted in the Figs. at 17. As is perhaps shown best in FIG. 3, the embodiment depicted in this view includes a plurality of slots 20 defined in photomask 2. Typically, slots 20 are formed in an area of chrome outward of pattern 17. Slots 20 extend for a length greater than the width of pellicle frame 14, and therefore typically have a length of about 2 to 3 mm. Slots 20 are typically extremely shallow in depth and narrow in width, often no more than one micron deep or wide. Therefore, it can be seen that the size of slots 20 in FIGS. 4–6 are greatly exaggerated for purposes of illustration.

Typically, hundreds or thousands of slots 20 are included. However, there may be as few as one such slot, as shown at 120 in FIG. 3A. While FIGS. 3 and 3A show slots 20 and 120 extending outwardly in a straight line under pellicle frame 14, it is preferable that the slots be stepped or zigzagged as shown at 220 and 320 in FIG. 3B. While 90° steps are included in slots 220 and 320, the steps may take the form of other acute or obtuse angles. Alternatively or additionally, the slots may extend angularly as shown at 420 in FIG. 2B.

As noted above and as depicted, pattern 17 terminates well inboard of pellicle frame 14. Thus, other than slots 20, 120, 220, 320 and 420 are the only interruption in the smooth chrome layer 18 to which pellicle frame 14 is mounted. Thus, an adhesive layer 22 that is applied to secure pellicle frame 14 to the chrome layer 18 of photomask 10 provides a secure mounting therebetween. The adhesive layer is normally applied to the underside of pellicle frame 14 prior to mounting but in certain applications may be applied directly to the photomask.

As shown in FIG. 6, in certain applications the existence of adhesive layer 22 actually causes the depth of slots 20 to be even more shallow than one micron. This is because the adhesive layer 22 may either be in the form of a liquid or semi-liquid adhesive, or may be in the form of a soft double sided tape or other adhesive layer. Typically, hot melt adhesive such as polyethylene butyl styrene is used, or double sided tape in the form of acrylic adhesive. Because of the fluidity or softness of adhesive layer 22, the adhesive will tend to pass into some of the slots 20, as shown at 22A in FIG. 6. As shown in this Figure, the depicted embodiment provides a minutely dimensioned slot that can trap particulate which is even smaller than one micron. Because of the many slots that may be provided (up to one thousand or more), the complete blockage of any one slot will not adversely affect the pressure-equalizing function of the system. Moreover, if the slots take the form of angularly extending slot 420 (FIG. 3B), there is a greater length in which any particulate can be trapped or engaged by adhesive layer 22. The most preferred embodiment of the slots are the stepped slots 220 or 320 (FIG. 3B) because particulate is most likely to be engaged by the adhesive layer during the abrupt changes in direction in the slots.

In order to fabricate the depicted system, photomask 10 is fabricated using conventional photoresist techniques. Slots 20, 120, 220, 320 and/or 420 are therefore formed in much the same way and at the same time as the mask pattern. This way the slots are added at virtually no additional expense, and they are precisely sized and positioned in the photomask. Adhesive layer 22 is typically applied to the underside of pellicle frame 14 shortly prior to mounting to photomask 10. By means of an automated mounting process, pellicle frame 14 with the pellicle membrane mounted thereto is precisely positioned over the photomask and dropped into place. Because of the existence of slots 20, 120, 220, 320 and/or 420, there will be little or no pressure differential between the area inside and outside of the pellicle frame 14, even at the precise moment the pellicle is dropped into position.

Shortly after pellicle frame 14 is positioned on the photomask, adhesive layer 22 begins to cure, but not until some of the adhesive drops downwardly into slots 20, 120, 220, 320 and/or 420, as shown in FIG. 6. The presence or amount of such adhesive flowing into the slots will vary depending upon the viscosity of the adhesive. However, because there will likely be so many slots (one thousand or more), this should not affect the pressure-equalization function of the slots even if more than a few slots are completely blocked off. In the event only a few such slots are provided or where, as in FIG. 3A, only one such slot 120 is provided, normally a more viscous adhesive or double sided tape is used so that complete blockage of the slots is likely.

After pellicle frame 14 is mounted in position on photomask 10, any pressure fluctuation outside of the pellicle will be immediately equalized as air passes through slots 20, 120, 220, 320 and/or 420. Because of the minute size of the slots, any particulate will be filtered out of the air. Such pressure fluctuations can occur to a limited extend with normal ambient air heating and cooling, or can occur in a more substantial way when the pellicle-protected photomask is shipped via air.

When the pellicle needs to be replaced, pellicle frame 14 is merely pulled off of photomask 10 and the photomask is cleaned. A new pellicle can then be re-applied to the photomask without having to replace any filters, form any openings in the adhesive layer, or do anything else to create an additional means for equalizing pressure differentials.

The disclosure set forth above may encompass multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements. It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

What is claimed is:

1. An optical pellicle system, comprising:
    a frame with a top side and a bottom side;
    a pellicle membrane configured to cover the top side of the frame;
    a photomask to which the bottom side of the frame is mounted; and
    at least one venting slot defined in the photomask, extending under the frame from an area defined within the frame to an area outside of the frame.

2. The optical pellicle system of claim 1, further comprising an adhesive layer positioned between the frame and the pattern to secure the frame thereto.

3. The optical pellicle system of claim 1, wherein the adhesive layer extends at least partially into at least one of the venting slots.

4. The optical pellicle system of claim 1, further comprising a plurality of the venting slots.

5. The optical pellicle system of claim 1, wherein at least one of the slots is stepped.

6. A process for forming a vented pellicle-protected photomask, comprising the following steps:

fabricating a photomask having at least one outwardly-extending venting slot formed therein;

positioning a framed optical pellicle over the photomask, the pellicle including a pellicle frame having a pellicle membrane mounted there;

placing the pellicle frame over the venting slot such that the slot extends from beyond one edge of the frame beyond the other edge; and placing the frame onto the photomask.

7. The process of claim 6, further comprising applying adhesive to the pellicle frame before placing the pellicle frame on the photomask.

8. The process of claim 7, further comprising applying adhesive to the photomask before placing the pellicle frame onto the photomask.

9. The process of claim 6 or 7, further comprising:

permitting adhesive to pass at least partially into the slots.

10. A photomask including a pattern defined therein, the pattern corresponding to a circuit to be etched during photolithography, the photomask further including a plurality of slots extending outwardly from adjacent the patterned portion.

11. The photomask of claim 10 wherein the pattern and the slots are defined by at least one chrome layer applied to the substrate.

12. The photomask of claim 10 wherein the slots are at least 2 mm in length.

13. The photomask of claim 10 wherein the slots are approximately 1 micron square.

14. The photomask of claim 10, wherein the slots are stepped.

15. A process for venting a pelliclized photomask comprising:

fabricating a photomask with a pattern formed on at least one surface thereof, the pattern corresponding to a circuit to be etched during photolithography, the photomask further including a plurality of generally outwardly extending venting slots defined therein;

mounting a framed pellicle to the photomask, the pellicle including a pellicle frame having a pellicle membrane mounted to an upper surface thereof, the pellicle frame having a lower surface mounted to the photomask such that at least some of the slots extend from a point inward of the pellicle frame to a point outward of the pellicle frame; and venting across the pellicle frame by permitting air to pass through the venting slots.

16. The process of claim 15, further comprising applying adhesive to one or both of the lower surfaces of the pellicle frame and the portion of the photomask to which the pellicle frame is to be mounted, prior to the steps of mounting the framed pellicle to the photomask, and permitting adhesive to pass into at least a portion of at least one of the slots after the adhesive has come into contact with the photomask.

* * * * *